United States Patent
Jacob

(10) Patent No.: US 9,633,947 B2
(45) Date of Patent: Apr. 25, 2017

(54) FOLDED BALLISTIC CONDUCTOR INTERCONNECT LINE

(71) Applicant: GLOBALFOUNDRIES Inc., Grand Cayman (KY)

(72) Inventor: Ajey Poovannummoottil Jacob, Watervliet, NY (US)

(73) Assignee: GLOBALFOUNDRIES Inc., Grand Cayman (KY)

( * ) Notice: Subject to any disclaimer, the term of this patent is extended or adjusted under 35 U.S.C. 154(b) by 15 days.

(21) Appl. No.: 14/608,337

(22) Filed: Jan. 29, 2015

(65) Prior Publication Data

US 2016/0225719 A1  Aug. 4, 2016

(51) Int. Cl.
| | | |
|---|---|---|
| *H01L 21/20* | (2006.01) | |
| *H01L 23/532* | (2006.01) | |
| *H01L 23/528* | (2006.01) | |
| *H01L 23/522* | (2006.01) | |
| *H01L 21/768* | (2006.01) | |

(52) U.S. Cl.
CPC .... *H01L 23/53276* (2013.01); *H01L 21/7682* (2013.01); *H01L 21/76843* (2013.01); *H01L 21/76879* (2013.01); *H01L 23/5226* (2013.01); *H01L 23/5283* (2013.01); *H01L 23/53238* (2013.01); *H01L 2221/1094* (2013.01)

(58) Field of Classification Search
CPC ........... H01L 51/0048; H01L 23/49827; H01L 23/49877; H01L 23/5384; H01L 51/057; H01L 23/53276; H01L 51/444
USPC .................................. 257/734, 773, 784, 776
See application file for complete search history.

(56) References Cited

U.S. PATENT DOCUMENTS

| | | | | |
|---|---|---|---|---|
| 4,792,790 A | * | 12/1988 | Reeb ................... | G06K 19/0672 257/E27.114 |
| 7,015,142 B2 | * | 3/2006 | DeHeer ............... | H01L 21/0405 257/E21.041 |
| 7,772,059 B2 | * | 8/2010 | Parikh ................. | H01L 29/1606 438/142 |
| 8,698,226 B2 | * | 4/2014 | Jain ................... | H01L 29/66977 257/317 |

* cited by examiner

Primary Examiner — S. V. Clark
(74) Attorney, Agent, or Firm — Amerson Law Firm, PLLC

(57) ABSTRACT

A method includes forming a folding template in a first dielectric layer. The folding template has a plurality of surfaces that are positioned in different planes. A ballistic conductor line is formed on the plurality of surfaces of the folding template. A device includes a first dielectric layer and a vertically folded line disposed in the first dielectric layer, the vertically folded line including a ballistic conductor material.

21 Claims, 3 Drawing Sheets

FOLDED BALLISTIC CONDUCTOR INTERCONNECT LINE

BACKGROUND OF THE INVENTION

1. Field of the Invention

The disclosed subject matter relates generally to the fabrication of semiconductor devices and, more particularly, to forming a folded ballistic conductor interconnect line.

2. Description of the Related Art

In modern integrated circuits, minimum feature sizes, such as the channel length of field effect transistors, have reached the deep sub-micron range, thereby steadily increasing performance of these circuits in terms of speed and/or power consumption and/or diversity of circuit functions. As the size of the individual circuit elements is significantly reduced, thereby improving, for example, the switching speed of the transistor elements, the available floor space for interconnect lines electrically connecting the individual circuit elements is also decreased. Consequently, the dimensions of these interconnect lines and the spaces between the metal lines have to be reduced to compensate for a reduced amount of available floor space and for an increased number of circuit elements provided per unit area.

Interconnect lines can be generally categorized into three groups: signal, clock and power lines. These interconnect types have different and, in some cases, opposing requirements. Signal lines require small capacitance and are less sensitive to resistance especially for short interconnects. Signal lines are almost immune from electromigration because they pass bidirectional currents. Thus, for signal lines, low aspect ratio lines are favored. Clock lines, which have an activity factor of 1, require low resistance and small capacitance. Clock lines, however, can fail due to electromigration because of the large currents they pass and because, in some cases, the current path is different in charge and discharge durations. Power lines are particularly susceptible to electromigration failure due to large currents flowing mainly in one direction.

In integrated circuits, one limiting factor as it related to device performance is the signal propagation delay caused by the switching speed of the transistor elements. However, as the channel length of these transistor elements has now reached 50 nm and less on more modern integrated circuits, the signal propagation delay is no longer limited by the switching speed of the field effect transistors. Rather, the signal propagation delay is limited in large part, owing to the increased circuit density, by the interconnect lines, since the line-to-line capacitance (C) is increased and also the resistance (R) of the lines is increased due to their reduced cross-sectional area. The parasitic RC time constants for signal lines tends to limit the performance of the semiconductor devices.

Conventional dual damascene interconnect techniques typically result in lines having the same aspect ratio in a particular metallization layer. Hence, it is difficult to optimize the constructs of the lines depending on their intended function: signal, clock or power.

The present application is directed to various methods for forming folded ballistic conductor interconnect lines so as to eliminate or reduce the effects of one or more of the problems identified above.

SUMMARY OF THE INVENTION

The following presents a simplified summary of the invention in order to provide a basic understanding of some aspects of the invention. This summary is not an exhaustive overview of the invention. It is not intended to identify key or critical elements of the invention or to delineate the scope of the invention. Its sole purpose is to present some concepts in a simplified form as a prelude to the more detailed description that is discussed later.

Generally, the present disclosure is directed to various methods of forming conductive lines. One illustrative method includes, among other things, forming a folding template in a first dielectric layer. The folding template has a plurality of surfaces that are positioned in different planes. A ballistic conductor line is formed on the plurality of surfaces of the folding template.

An illustrative device includes, among other things, a first dielectric layer and a vertically folded line disposed in the first dielectric layer, the vertically folded line including a ballistic conductor material.

BRIEF DESCRIPTION OF THE DRAWINGS

The disclosure may be understood by reference to the following description taken in conjunction with the accompanying drawings, in which like reference numerals identify like elements, and in which.

Figure 1A:
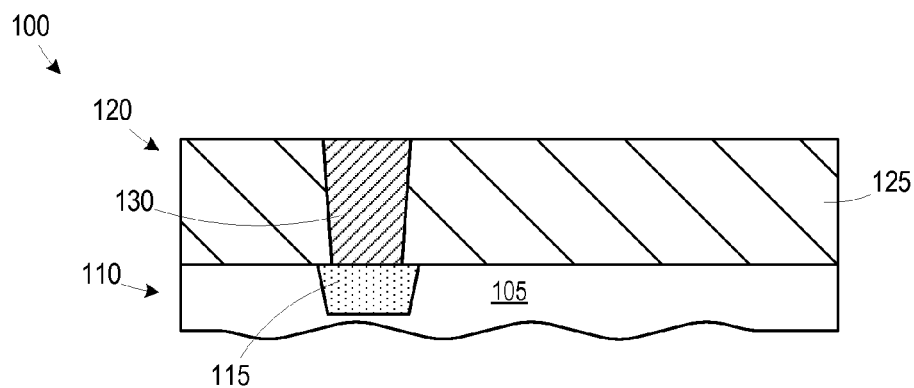
FIGS. 1A-1H are cross-sectional diagrams depicting illustrative techniques for forming folded ballistic conductor lines in an interconnect structure.

While the subject matter disclosed herein is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION

Various illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

The present subject matter will now be described with reference to the attached figures. Various structures, systems and devices are schematically depicted in the drawings for purposes of explanation only and so as to not obscure the present disclosure with details that are well known to those skilled in the art. Nevertheless, the attached drawings are included to describe and explain illustrative examples of the present disclosure. The words and phrases used herein should be understood and interpreted to have a meaning consistent with the understanding of those words and phrases by those skilled in the relevant art. No special definition of a term or phrase, i.e., a definition that is different from the ordinary and customary meaning as understood by those skilled in the art, is intended to be implied by consistent usage of the term or phrase herein. To the extent that a term or phrase is intended to have a special meaning, i.e., a meaning other than that understood by skilled artisans, such a special definition will be expressly set forth in the specification in a definitional manner that directly and unequivocally provides the special definition for the term or phrase. The present disclosure is directed to various methods of forming an interconnect structure. With reference to the attached drawings various illustrative embodiments of the methods and devices disclosed herein will now be described in more detail.

FIGS. 1A-1G are cross-sectional diagrams illustrating one illustrative method disclosed herein for forming folded ballistic conductor lines in a semiconductor device 100, which, in the present embodiment, may be represented by an integrated circuit including circuit elements, such as transistors, capacitors, resistors and the like.

FIG. 1A illustrates the device 100 including a substrate 105 having a device layer 110 formed in and above the substrate 105 in which semiconductor-based circuit elements, such as transistors, resistors and the like, may be provided. For convenience, any such circuit elements are not shown in FIG. 1A. The substrate 105 may also include any appropriate microstructure features, such as micromechanical components, optoelectronic components and the like, wherein at least some of these components may require a conductive inter-connect structure. In highly complex integrated circuits, a very large number of electrical connections may be required and, thus, a plurality of metallization layers may typically be formed in the metallization system. The device layer 110 includes contacts 115 (e.g., tungsten) for contacting underlying devices, such as transistors (not shown). A first metallization layer 120 (sometimes referred to in the industry as the "M1" or "metal 1" layer), including a first dielectric layer 125 and an embedded via 130, is formed above the device layer 110. In the illustrated embodiment, the dielectric layer 125 may be a low-k dielectric material having a dielectric constant of approximately 3.0 or lower or an ultra-low-k (ULK) material having a dielectric constant of approximately 2.5 or lower.

Figure 1B:
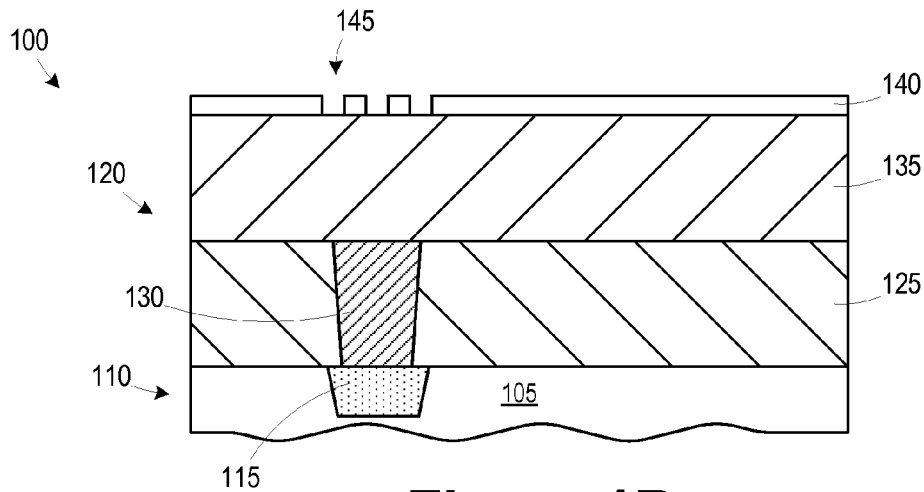

FIG. 1B illustrates the device 100 after a first deposition process was performed to form a second dielectric layer 135, a second deposition process was performed to form a mask layer 140 (e.g., silicon nitride), and a photolithography process was performed to pattern the mask layer 140 to define openings 145. The dielectric layers 125, 130 may be the same or different materials.

Figure 1C:
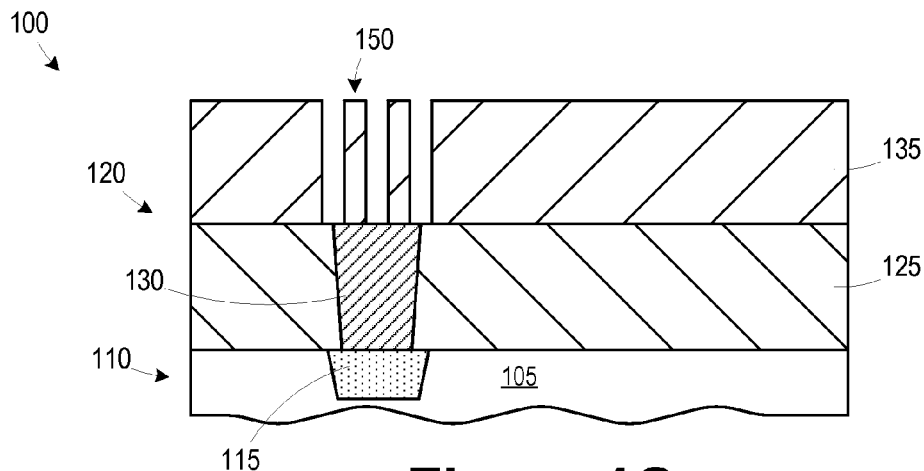

FIG. 1C illustrates the device 100 after an etch process was performed through the openings 145 to pattern the second dielectric layer 135 to define a folding template 150 therein above the via 130. The folding template 150 exposes one or more portions of the underlying via 130 and runs into and out of the page to provide a linear path for subsequently forming a conductive line. For example, the folding template 150 may engage an additional via (not shown) in a different portion of the device 100.

Figure 1D:
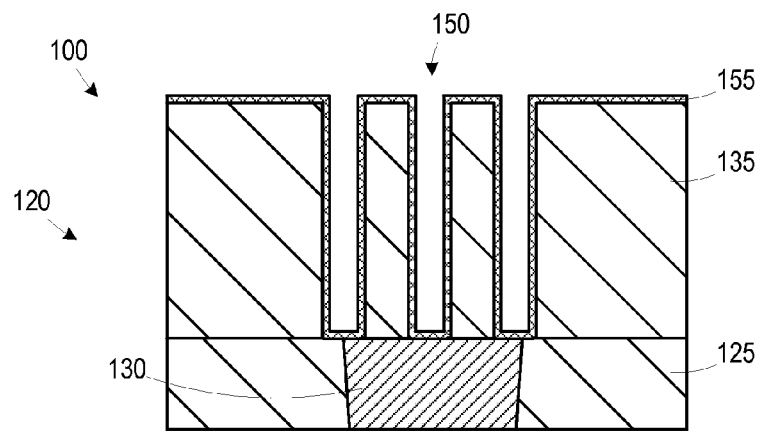

FIG. 1D illustrates a close-up view of the device 100 showing the folding template 150 of FIG. 1C after a conformal deposition process was performed to deposit a cladding layer 155 (e.g., copper or boron nitride, etc.) above the second dielectric layer 135 and covering the folding template 150. In some embodiments, the cladding layer 155 may include multiple layers. For example, in an embodiment where copper is employed in the cladding layer 155, a barrier layer (e.g., Ta, TaN, TiN, etc.) (not separately shown) may be formed beneath a copper layer (not separately shown).

Figure 1E:
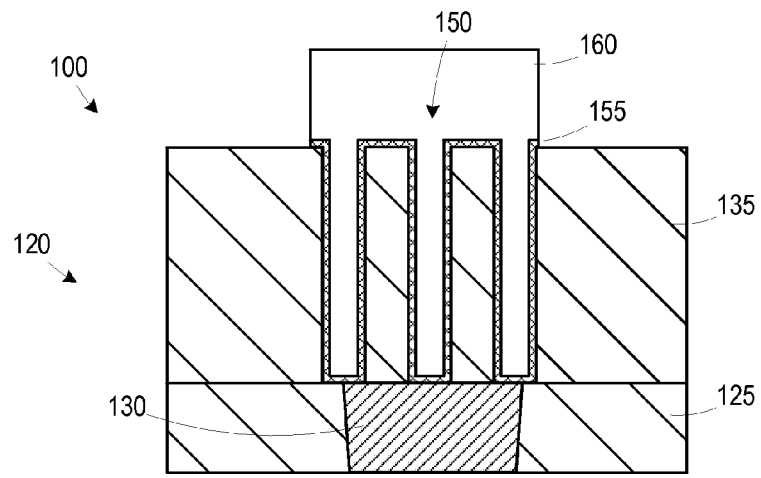

FIG. 1E illustrates the device 100 after a patterned mask layer 160 (e.g., photoresist) was formed above the folding template 150 and an etch process was performed to remove portions of the cladding layer 155 not covered by the patterned mask layer 160. Forming the cladding layer 155 over the folding template 150 increases the effective width of the cladding layer 155 if it were to be unfolded. The lateral width of the patterned mask layer 160 may be varied to change the effective unfolded width of the cladding layer 155 by modulating the size of the portion of the cladding layer 155 disposed on horizontal surfaces of the second dielectric layer 135 after the cladding layer 155 is patterned.

Figure 1F:
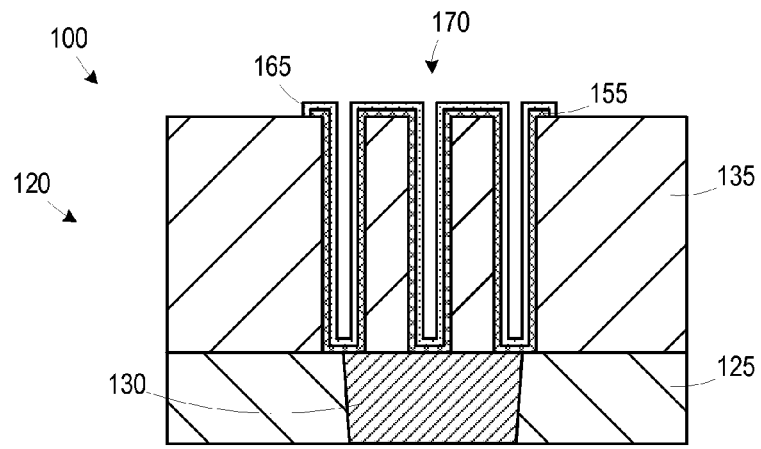

FIG. 1F illustrates the device 100 after the patterned mask layer 160 was removed and after a ballistic conductor layer 165 was formed using the cladding layer 155 as a deposition template to define a ballistic conductor line 170 (e.g., the ballistic conductor material is formed selectively on the cladding material). The manner in which the ballistic conductor material is formed is well known to those skilled in the art.

Figure 1G:
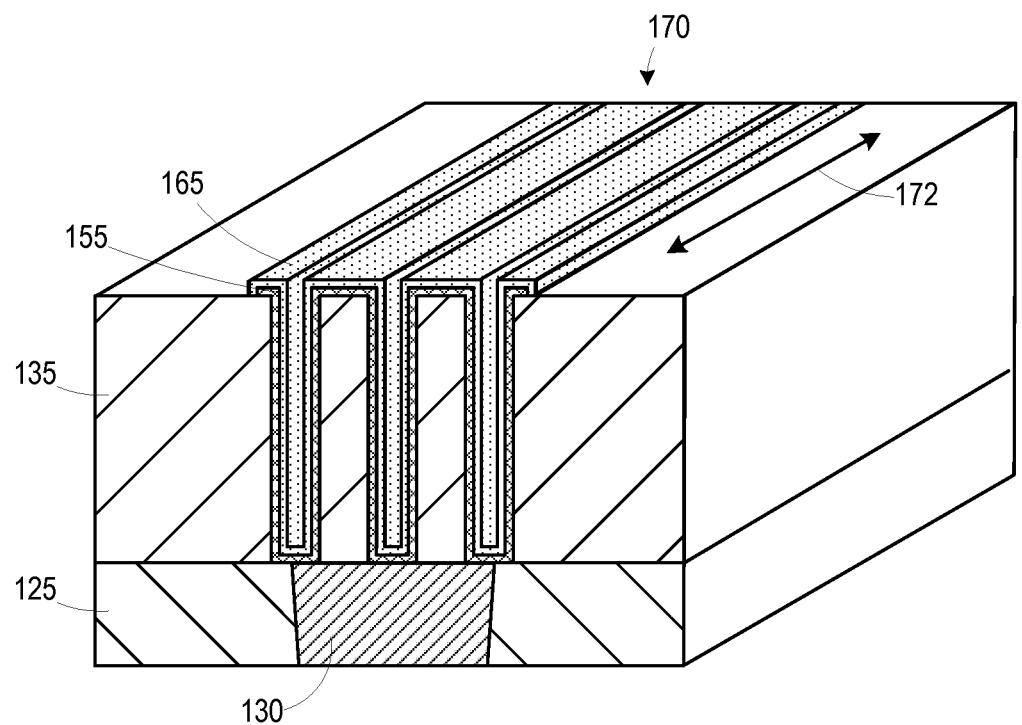

FIG. 1G illustrates a perspective view of the ballistic conductor line 170. In general, the ballistic conductor line 170 has a vertically serpentine cross-section along its length 172 resulting from the planar surfaces of the folding template 150 being oriented in different planes (e.g., horizontal and vertical). The effective width of the ballistic conductor line 170 depends on the number of folds defined by the surfaces of the folding template 150. The ballistic conductor layer 165 is formed from a material that exhibits ballistic conduction, also referred to as ballistic transport, where the transport of electrons occurs in a medium having negligible electrical resistivity caused by scattering. In contrast, a conventional Ohmic conductor material has a resistivity value that is in large part defined by the degree of scattering within the material. In some embodiments, the ballistic conductor layer 165 may include a plurality of layers of ballistic conductor material formed in a stack. In other embodiments, a stack may be formed by alternating layers of ballistic conductor material and cladding material.

Exemplary ballistic conductor materials include graphene, carbon nanotubes, silicon nanowires, samarium hexaboride, stanene, silicene, boronene and topolocial insulators, such as mercury telluride, cadmium telluride, bismuth antimonide, pure antimony, bismuth selenide, bismuth telluride and antimony telluride. In general, ballistic conductor materials provide low-capacitance signal paths with very thin material layers. In general, ballistic conductor materials may be formed in very thin sheets, sometime as thin as the thickness of a single atom. The manner in which such ballistic conductor materials may be formed is known to those skilled in the art.

In some embodiments, the patterning of the cladding layer 155 illustrated in FIG. 1E may occur after the ballistic conductor layer 165 is formed, such that exposed portions of both the cladding layer 155 and the ballistic conductor layer 165 are selectively removed using the patterned mask layer 160.

Figure 1H:
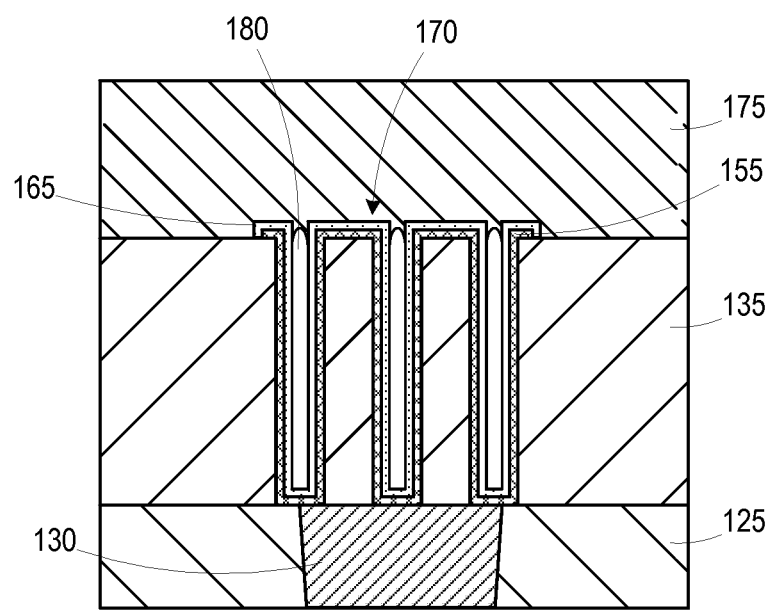

FIG. 1H illustrates the device 100 after a third dielectric layer 175 is formed above the second dielectric layer 135. The dielectric layers 125, 135, 175 may be the same or different materials. In some embodiments, the third dielectric layer may be a thin layer that only makes up for the height offset due to the portion of the ballistic conductor line 170 above the horizontal surface of the second dielectric layer 135. In some embodiments, the third dielectric layer 175 may not completely fill the space between the folds, leaving air gaps 180. Such air gaps 180 may be beneficial for reducing capacitance of the ballistic conductor line 170, thereby improving performance. In other embodiments, the third dielectric layer 175 may substantially fill the recesses between the folds in the ballistic conductor line 170. Additional processing steps may be performed to complete the fabrication of the device 100, such as the formation of additional metallization layers.

The use of folded ballistic conductor lines 170 within the metallization layer 120 allows the RC characteristics of the line 170 to be controlled depending on the length of the line 170 and the amount of current required to be carried by the line 170. To increase the current-carrying capacity of the ballistic conductor line 170, the effective line width may be increased by including additional folds in the folding template 150 or by increasing the portion of the cladding layer 155 and the ballistic conductor layer 165 that is disposed on the horizontal surface of the second dielectric layer 135 (see FIG. 1E). The folded ballistic conductor lines 170 may be used in conjunction with other conductive lines (not shown), such as copper lines. For example, a folded ballistic conductor line 170 may be used to connect two relatively closely spaced devices, such as transistors, and a copper line (not shown) may connect to the folded ballistic conductor line 170 through a via for a longer interconnect (not shown).

The particular embodiments disclosed above are illustrative only, as the invention may be modified and practiced in different but equivalent manners apparent to those skilled in the art having the benefit of the teachings herein. For example, the process steps set forth above may be performed in a different order. Furthermore, no limitations are intended to the details of construction or design herein shown, other than as described in the claims below. It is therefore evident that the particular embodiments disclosed above may be altered or modified and all such variations are considered within the scope and spirit of the invention. Accordingly, the protection sought herein is as set forth in the claims below.

What is claimed:

1. A method, comprising:
    forming a folding template in a first dielectric layer, said folding template having a plurality of surfaces that are positioned in different planes; and
    forming a ballistic conductor line on said plurality of surfaces of said folding template, said ballistic conductor line having a vertical serpentine cross section along its length corresponding to said plurality of surfaces of said folding template.

2. The method of claim 1, wherein forming said ballistic conductor line comprises:
    forming a cladding layer above said first dielectric layer and said folding template;
    forming a patterned mask layer covering a portion of said cladding layer disposed above said folding template; and
    performing an etch process to remove portions of said cladding layer not covered by said patterned mask layer.

3. The method of claim 2, wherein forming said ballistic conductor line further comprises forming a ballistic conductor layer on said cladding layer.

4. The method of claim 1, wherein forming said ballistic conductor line comprises:
    forming a cladding layer above said first dielectric layer and said folding template;
    forming a ballistic conductor layer on said cladding layer;
    forming a patterned mask layer covering a portion of said ballistic conductor layer and said cladding layer disposed above said folding template; and
    performing an etch process to remove portions of said ballistic conductor layer and said cladding layer not covered by said patterned mask layer.

5. The method of claim 1, wherein said ballistic conductor line comprises a cladding layer and a ballistic conductor layer.

6. The method of claim 5, wherein said cladding layer comprises a barrier layer formed on said plurality of surfaces and a copper layer formed above said barrier layer.

7. The method of claim 1, further comprising forming a conductive feature in a second dielectric layer disposed beneath said first dielectric layer, wherein said folding template exposes at least one portion of said conductive feature, and said ballistic conductor line contacts said at least one exposed portion.

8. The method of claim 7, wherein said conductive feature comprises a via.

9. The method of claim 1, further comprising forming a second dielectric layer above said first dielectric layer and above said ballistic conductor line.

10. The method of claim 1, wherein said plurality of surfaces comprises at least two adjacent vertical surfaces, the method further comprising forming a second dielectric layer above said first dielectric layer and above said ballistic conductor line without filling a space between said at least two adjacent vertical surfaces to define an air gap between said at least two adjacent vertical surfaces.

11. The method of claim 1, wherein said ballistic conductor line comprises graphene.

12. A device, comprising:
    a first dielectric layer; and
    a vertically folded line having a vertical serpentine cross section along its length disposed in said first dielectric layer, said vertically folded line comprising a ballistic conductor material.

13. The device of claim 12, wherein a portion of said vertically folded line is disposed above a horizontal surface of said first dielectric layer.

14. The device of claim 12, wherein said vertically folded line comprises a ballistic conductor layer and a cladding layer.

15. The device of claim 14, wherein said cladding layer comprises a barrier layer and a copper layer formed above said barrier layer.

16. The device of claim 12, further comprising forming a conductive feature in a second dielectric layer disposed beneath said first dielectric layer, wherein said vertically folded line contacts said conductive feature.

17. The device of claim 16, wherein said conductive feature comprises a via.

18. The device of claim 12, wherein said vertically folded line comprises at least two adjacent vertical surfaces, further comprising a second dielectric layer disposed above said first dielectric layer and above said vertically folded line without filling a space between said at least two adjacent vertical surfaces to define an air gap between said at least two adjacent vertical surfaces.

19. The device of claim 12, wherein said ballistic conductor material comprises graphene.

20. A device, comprising:
    a first dielectric layer; and
    a vertically folded line disposed in said first dielectric layer, said vertically folded line comprising a ballistic conductor material, wherein a portion of said vertically folded line is disposed above a horizontal surface of said first dielectric layer.

21. The device of claim 20, wherein said vertically folded line comprises a ballistic conductor layer and a cladding layer, wherein said cladding layer comprises a barrier layer and a copper layer formed above said barrier layer.

* * * * *